United States Patent [19]

Benzie et al.

[11] 3,958,196

[45] May 18, 1976

[54] COIL TUNING APPARATUS

[75] Inventors: James D. Benzie, Toronto; Kenneth C. Lepper, Ajax; Leslie K. Iwata, Agincourt, all of Canada

[73] Assignee: Rockwell International Corporation, El Segundo, Calif.

[22] Filed: Feb. 20, 1975

[21] Appl. No.: 551,469

[52] U.S. Cl. .................................... 334/71; 334/72; 336/137; 336/138; 336/144

[51] Int. Cl.² .............................................. H03J 3/20

[58] Field of Search .......................... 334/70, 71, 72; 336/137, 138, 140, 141, 144

[56] References Cited

UNITED STATES PATENTS

| | | | |
|---|---|---|---|
| 2,804,544 | 8/1957 | Lannan et al. | 334/72 X |
| 2,988,638 | 6/1961 | Knausenberger | 334/70 X |
| 3,133,235 | 5/1964 | Shepherd, Jr. | 336/137 X |

*Primary Examiner*—Saxfield Chatmon, Jr.
*Attorney, Agent, or Firm*—Bruce C. Lutz; Robert J. Crawford

[57] ABSTRACT

The method of and apparatus for changing the inductance of a high power air core coil through the process of selectively shorting out predetermined numbers of turns. The apparatus comprises a conductive belt which is positioned interior the coil whereby the problems of corona discharge from the winding contents are substantially reduced. Since the shorting conductor is a thin film of conductive material attached to a tape, the mass is very low and vibration forces applied to the unit have much less effect in producing interruptions of contact.

6 Claims, 2 Drawing Figures

COIL TUNING APPARATUS

THE INVENTION

The present invention is generally related to electronics and more specifically to radio frequency or other high voltage air core coils.

In the prior art, there have been many attempts to change the total inductive effect of a coil. Among the prior attempts is the use of a rod or a bar which travels the length of the coil and engages contacts for the purpose of shorting out portions of the coil on a step-by-step basis. The disadvantage of such a rod is that it requires additional space equivalent to the length of the coil for storage of the rod when none of the coils of the inductor are being shorted.

Another prior art approach to the problem of changing the inductance of the coil was to connect a plurality of wires to turns at various positions on the coils and run all of these wires to a shorting switch at some position away from the coil. However, there were problems with high voltage breakdown of the insulation on the wires and a further problem of arcing between the contacts of the switch itself.

Further, in all the known prior art, this rod is positioned on the outside of the coil whereby it engages contacts on the outside of the coil. An additional problem with the prior art mechanism is that these high voltage contacts tend to discharge or arc to any nearby conductive object at a lower potential (i.e., the enclosure). On the inside of the coil, the voltage gradients are more uniform and the likelihood of an object to which corona discharge can take place are minimized. Thus, the design of the contacts, tape guide and conductor may be much simpler and do not of necessity need to use smooth, round and arc resistant materials that would be outside the coil. Thus, special enclosures or devices as would be required to shield the contacts or conductors from corona discharge are not required as this function is provided for by the coil itself. Since the conductive material is flexible, it can be wound on reels at the base and top of the coil and thus very little additional space is required for the storage of the conductive material when none of the coils of the inductor are being shorted out.

An additional benefit of the present invention is that with the shorting conductor always being positioned primarily only in a shorted section of the coil, there is minimum loss of coil 'Q' in the active turns of the coil.

Finally, it should be noted that with the placement of the contacts and associated shorting material interior the coil there is less likelihood of mechanical damage thereto due to the physical protection provided by the coil turns.

It is, therefore, an object of the present invention to provide an improved means for changing the inductance of a coil.

Other objects and advantages of the present invention may be ascertained from a reading of the specification and the appended claims in conjunction with the drawings wherein:

Figure 1:
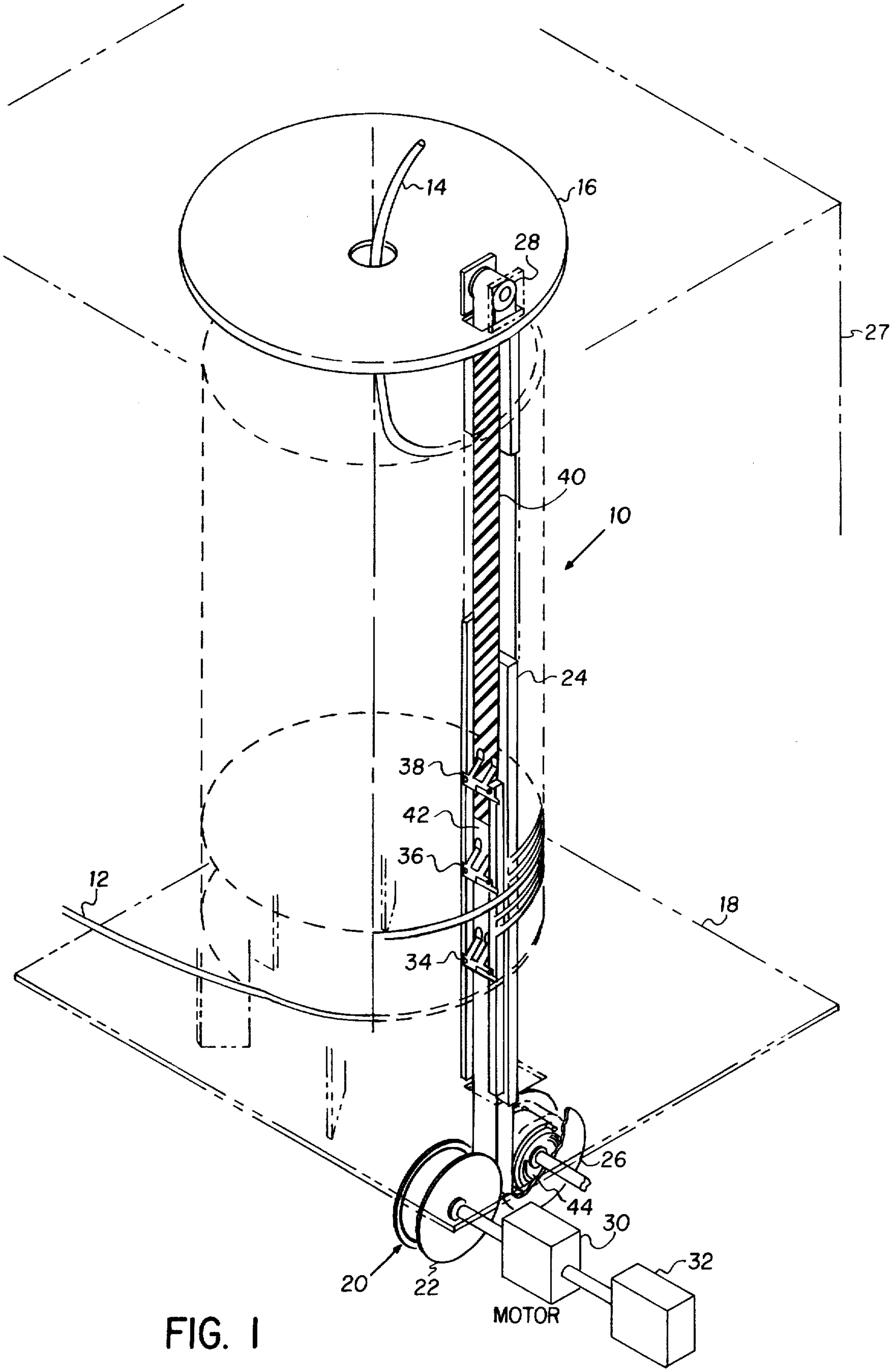
FIG. 1 is an illustration of a preferred embodiment of the invention.

In FIG. 1 a coil, shown in phantom outline and generally designated as 10, is illustrated with an incoming wire or lead 12. This lead 12 is connected to a series of turns of windings within the coil and exits as lead 14 at the upper extremity of coil 10. Lead 14 exits through a hole or opening in a lid 16. The coil 10 is mounted on a base mechanism 18 which also provides support for a tape drive mechanism generally designated as 20 and specifically comprising a supply reel 22, a superstructure 24 and a take-up reel 26. Base 18 also supports an enclosure 27 shown in phantom outline. At the upper end of superstructure 24 is an idler pulley 28. Attached to the supply reel is a motor 30 and a potentiometer or other position indicating device 32. Interior the coil 10 are a plurality of contacts such as 34, 36 and 38. A flexible tape 40 is illustrated as being supplied from reel 22, passed over idler pulley 28, and returned to be wound up on take-up reel 26. The tape 40 is illustrated as having a conductive portion 42 which as illustrated, rises to approximately one-third the height of coil 10. Thus, the windings on the coil from lead 12 (contact 34) up to the contact 36 are shorted out and have little effect on the inductance of the coil. As illustrated, the take-up reel 26 has a tape tension spring 44 contained interior thereof for producing a constant tension on the tape. Thus, as the motor dispenses tape from reel 22, the take-up reel 26 pulls the tape over the idler pulley onto spool 26. When the motor 30 turns in the opposite direction, it pulls the tape from take-up reel 26 over the pulley 28 and back onto reel 22. The position indicating device 32 through appropriate gearing can provide an indication of the relative position of the conducting ribbon 42 within the coil 10. This indication can be merely a mechanical indication or it can, through the use of a potentiometer, provide an electrical indication through the amount of current flowing through the potentiometer or a voltage appearing across a portion of a potentiometer.

As will be ascertained, if all of the conductive portion 42 of the tape 40 is contained within supply reel 22, none of the leads will be shorted and the inductance of the coil will be at a maximum. If, however, the tape is dispensed so that only the first set of contacts 34 are in contact with the conductive portion 42, there still will be no change in the inductance. It is not until the conducting ribbon 42 rises to short out one or more additional sets of contacts such as 36 that a portion of the coil is shorted out.

As was previously mentioned, the voltage gradient in the coil is substantially constant at a given height since the opposite side of the coil is at a voltage equivalent to that of one-half turn of a winding and thus would be relatively low in voltage difference. Therefore, the voltage gradients are all in a vertical direction and the change in voltage is small enough that there is little likelihood of arcing occurring from a set of contacts such as 38 to a further piece of conductive material at a different potential. The superstructure 24 is normally constructed of dielectrics such as glass and plastic and thus the only conductive material to which arcing can occur are the contacts and the conductive ribbon. In one embodiment of the invention, the maximum voltage potential between any set of adjacent contacts was 2500 volts and thus there was no problem with arcing between contacts and there was a very minimal amount of arcing from the contacts to the conducting ribbon 42 upon contact therewith.

Figure 2:
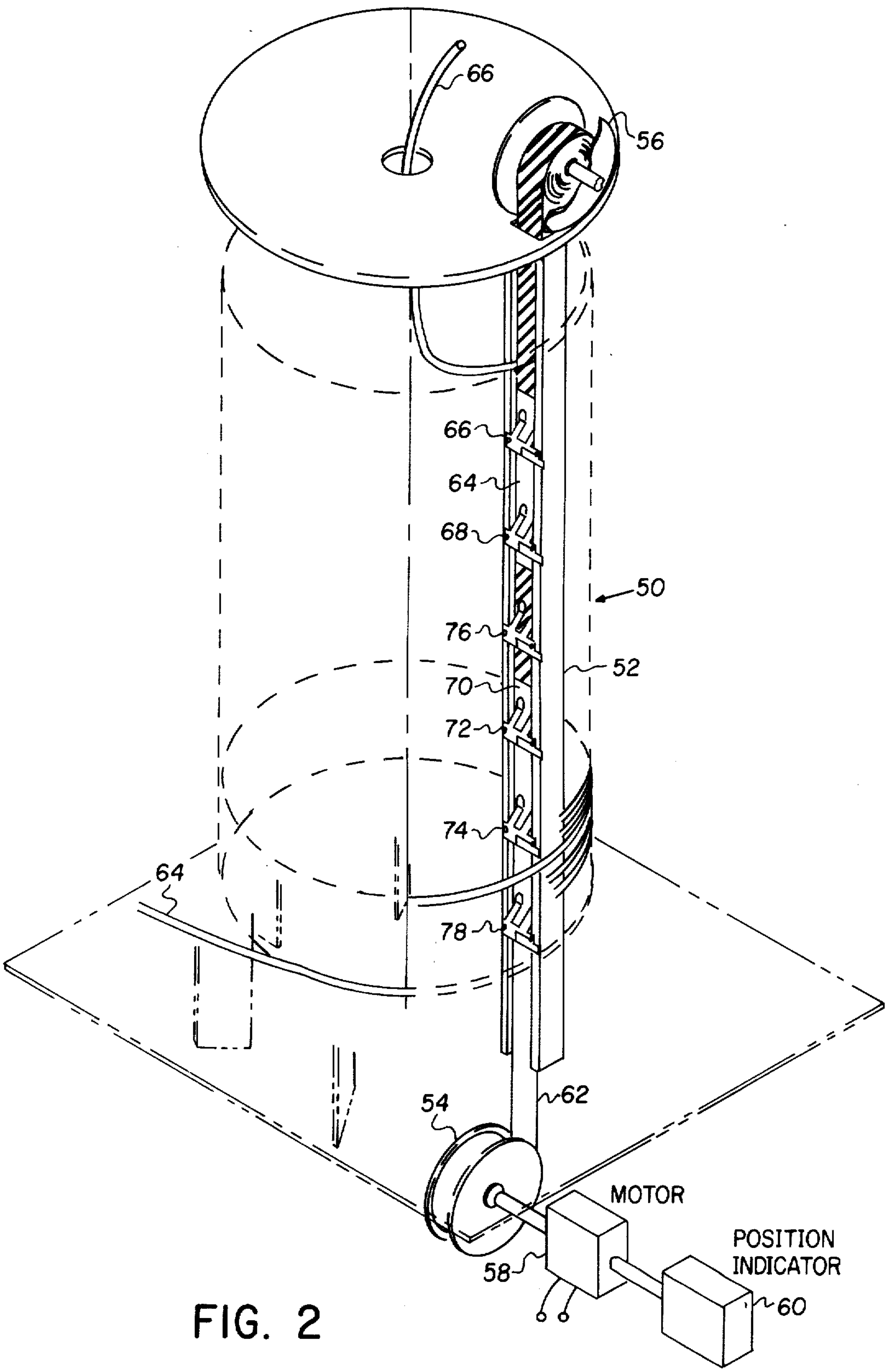
FIG. 2 is a modification of the embodiment of FIG. 1 while illustrating the same basic principles.

FIG. 2 illustrates a coil 50 which has a superstructure 52 mounted interior thereof with a dispensing reel 54 and a take-up reel 56. As will be noted, the take-up reel in this instance is mounted on the top of the coil 50 rather than at the bottom of the coil as illustrated in FIG. 1. A motor mechanism 58 drives the dispensing reel 54 and a position indicator 60 is utilized to provide an indication of tape 62 dispensed within the superstructure 52 as it is retrieved by the take-up reel 56. Again, a lead 64 terminates the winding at the bottom of the coil 50 and a lead 66 terminates the winding at the top of the coil 50. The apparatus of FIG. 2 is substantially identical with FIG. 1 except it is illustrated that the take-up reel 56 need not necessarily be positioned at the bottom of the coil.

The tape 62 has a first conductive portion 64 which as illustrated is shorting between the contacts 66 and 68 and a second conductive portion 70 which extends to the dispensing reel 54. As illustrated, this conductive portion shorts out the portions of the coil between contacts 72 and 74. Thus, the windings between contacts 72 and 68 and specifically those connected to contact 76 are not shorted and react as a normal inductor. Further, the windings above contact 66 are still operable to provide inductive reactance.

The above figures illustrate that the inventive concept may be practiced in a variety of ways and that the concept is directed to the broad idea of utilizing a flexible tape having a conductive portion thereon to short out one or more sections of an inductive coil to change the inductance thereof. As described above, these conductive portions on the tape need not all be contained in one continuous strip but rather, in some special embodiments, may have a plurality of conductive portions to short out specific portions of the coil at different times.

While the preferred embodiment has been illustrated as having spring tension drive take-up reels to remove slack, the drive motor could be optionally geared to the take-up reel and thereby eliminate the necessity of having a separate tension spring. However, such an embodiment would require a larger and more powerful motor. An intermediate solution, which has been used, is to drive both the take-up reel and the supply reel with the motor and also use a tension spring inside the take-up reel primarily to maintain tension. An embodiment constructed in the manner has the advantage of a less powerful tension spring than that illustrated for the preferred embodiment and a less powerful motor than is required to provide all the power for supply and take-up.

In view of the above, we wish to be limited not by the illustrations presented, but rather by the scope of the appended claims.

What is claimed is:

1. Inductance coil impedance changing means for use with an air core radio frequency coil having a plurality of contacts attached to predetermined coil turns and positioned interior the coil, the impedance changing means comprising, in combination:

nonconductive elongated tape guide means, for placement interior an inductive coil;

flexible tape means having first and second ends and including a conductive portion;

tape supply means for dispensing said flexible tape means in said tape guide means whereby the conductive portion of said flexible tape means extends a known distance along the length of said tape guide means;

means for attaching said tape supply means to one end of said flexible tape means; and tape take-up means, connected to the other end of said flexible tape for retrieving slack in said flexible tape means as it is dispensed by said tape supply means.

2. Apparatus as claimed in claim 1 comprising, in addition:

means attaching said tape supply means and said tape take-up means to said tape guide means.

3. Apparatus as claimed in claim 1 comprising, in addition:

means attaching said tape supply means and said tape take-up means to one end of said tape guide means.

4. Step variable impedance coil means comprising, in combination:

air core inductive coil means having a plurality of electrically conductive wire turns;

a plurality of conductive contacts attached to predetermined wire turns at an interior surface of said coil means;

tape guide means juxtaposed said conductive contacts;

flexible tape means, having first and second ends and including non-conductive and conductive portions for movement parallel an axis of said coil means and intermediate said contacts and said guide means;

tape supply means for dispensing said flexible tape means in said tape guide means whereby the conductive portion of said flexible tape means extends a known distance along the length of said tape guide means;

means for attaching said tape supply means to one end of said flexible tape means;

tape take-up means, connected to the other end of said flexible tape for retrieving slack in said flexible tape means as it is dispensed by said tape supply means.

5. Apparatus as claimed in claim 4 comprising, in addition:

means attaching said tape supply means and said tape take-up means to said tape guide means.

6. Apparatus as claimed in claim 4 comprising, in addition:

means attaching said tape supply means and said tape take-up means to one end of said tape guide means.

* * * * *